(12) United States Patent
Zhong

(10) Patent No.: US 12,402,268 B2
(45) Date of Patent: Aug. 26, 2025

(54) CASING ASSEMBLY AND ELECTRONIC DEVICE

(71) Applicant: WISTRON CORP., New Taipei (TW)

(72) Inventor: Yong-Qing Zhong, New Taipei (TW)

(73) Assignee: WISTRON CORP., New Taipei (TW)

( * ) Notice: Subject to any disclaimer, the term of this patent is extended or adjusted under 35 U.S.C. 154(b) by 187 days.

(21) Appl. No.: 18/466,025

(22) Filed: Sep. 13, 2023

(65) Prior Publication Data
US 2025/0016949 A1   Jan. 9, 2025

(30) Foreign Application Priority Data
Jul. 6, 2023   (CN) .......................... 202310828698.5

(51) Int. Cl.
*H05K 7/14*  (2006.01)
*G06F 1/18*  (2006.01)

(52) U.S. Cl.
CPC ........... *H05K 7/1487* (2013.01); *G06F 1/187* (2013.01)

(58) Field of Classification Search
CPC ..... G06F 1/187; G11B 33/128; H05K 7/1487; H05K 5/0221; H05K 7/1411; H05K 7/16
See application file for complete search history.

(56) References Cited

U.S. PATENT DOCUMENTS

| | | | |
|---|---|---|---|
| 10,104,803 B1* | 10/2018 | Lin | H05K 7/16 |
| 11,197,387 B2* | 12/2021 | Liu | G11B 33/128 |
| 2018/0157295 A1* | 6/2018 | Zhu | H05K 5/023 |

* cited by examiner

*Primary Examiner* — James Wu
(74) *Attorney, Agent, or Firm* — McClure, Qualey & Rodack, LLP

(57) ABSTRACT

The casing assembly includes a casing, a cage, a supporting component, an engagement component and an operation assembly. The cage is movably disposed in the casing. One end of the supporting component is pivotably disposed on the casing, and another end of the supporting component is slidably disposed on the cage. The engagement component is pivotably disposed on the cage and selectively engaged with the supporting component to position the cage. The operation assembly is movably disposed on the cage and connected to the engagement component. The operation assembly is movable relative to the cage, and the engagement component is driven to disengage from the supporting component via the operation assembly selectively.

20 Claims, 18 Drawing Sheets

CASING ASSEMBLY AND ELECTRONIC DEVICE

CROSS-REFERENCE TO RELATED APPLICATIONS

This non-provisional application claims priority under 35 U.S.C. § 119(a) on Patent Application No(s). 202310828698.5 filed in China on Jul. 6, 2023, the entire contents of which are hereby incorporated by reference.

TECHNICAL FIELD

The disclosure relates to a casing assembly and an electronic device.

BACKGROUND

An electronic device such as a server is usually equipped with an electronic module, such as a hard disk drive module (hereinafter "HDD module"). The cage of the HDD module is pivotably disposed on a server casing. After the cage is pivoted relative to the server casing, an installation opening of the cage can be shifted from its original position hidden inside the server casing to being exposed on the outside, so that a user or a maintainer can remove hard disk drives from the cage or insert the hard disk drives into the cage through the installation opening.

Conventionally, the cage is connected to a handle via a linkage mechanism, and the rotation movement of the cage is driven by the handle and the linkage mechanism. After the cage is pivoted relative to the server casing, the user or the maintainer needs to hold the handle for maintaining the cage at a position where the installation opening is exposed outside the server casing. However, the handle is exposed outside the server for being operated by the use or the maintainer, which adversely affects the appearance of the server. In addition, the structure of the link mechanism connecting the handle and the cage is too complicated. Accordingly, how to solve the aforementioned issues is a crucial topic in this field.

SUMMARY

The disclosure provides a casing assembly and an electronic device, which enable the cage to be fixed in the position where the installation opening thereof is exposed outside the server casing without the need for a handle while maintaining the appearance of the electronic device.

One embodiment of the disclosure provides a casing assembly. The casing assembly includes a casing, a cage, a supporting component, an engagement component and an operation assembly. The cage is movably disposed in the casing. One end of the supporting component is pivotably disposed on the casing, and another end of the supporting component is slidably disposed on the cage. The engagement component is pivotably disposed on the cage and selectively engaged with the supporting component to position the cage. The operation assembly is movably disposed on the cage and connected to the engagement component. The operation assembly is movable relative to the cage, and the engagement component is driven to disengage from the supporting component via the operation assembly selectively.

Another embodiment of the disclosure provides an electronic device. The electronic device includes a casing assembly. The casing assembly includes a casing, a cage, a supporting component, an engagement component and an operation assembly. The cage is movably disposed in the casing. One end of the supporting component is pivotably disposed on the casing, and another end of the supporting component is slidably disposed on the cage. The engagement component is pivotably disposed on the cage and selectively engaged with the supporting component to position the cage. The operation assembly is movably disposed on the cage and connected to the engagement component. The operation assembly is movable relative to the cage, and the engagement component is driven to disengage from the supporting component via the operation assembly selectively.

According to the casing assembly and the electronic devices as discussed in the above embodiments, one end of the supporting component is pivotably disposed on the casing, and another end of the supporting component is slidably disposed on the cage, the engagement component is pivotably disposed on the cage and is selectively engaged with the supporting component to position the cage, and the operation assembly is movably disposed on the cage and can drive the engagement component to disengage from the supporting component, and thus in a case that there is no handle provided in the casing assembly, the cage can still be fixed in the opened position or released from the opened position, while the appearance of the electronic device can be maintained.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
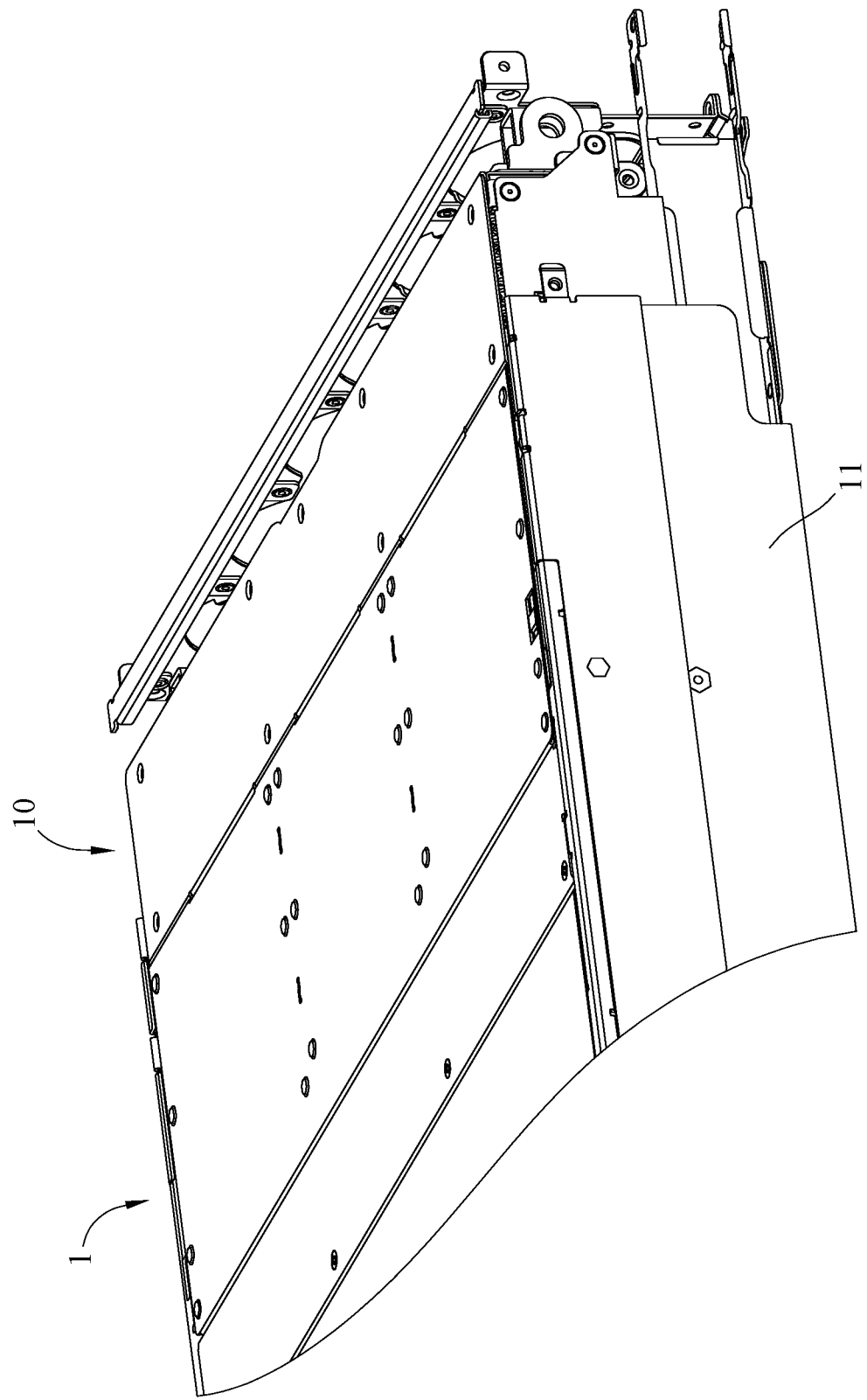
FIG. 1 is a partially perspective view of an electronic device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
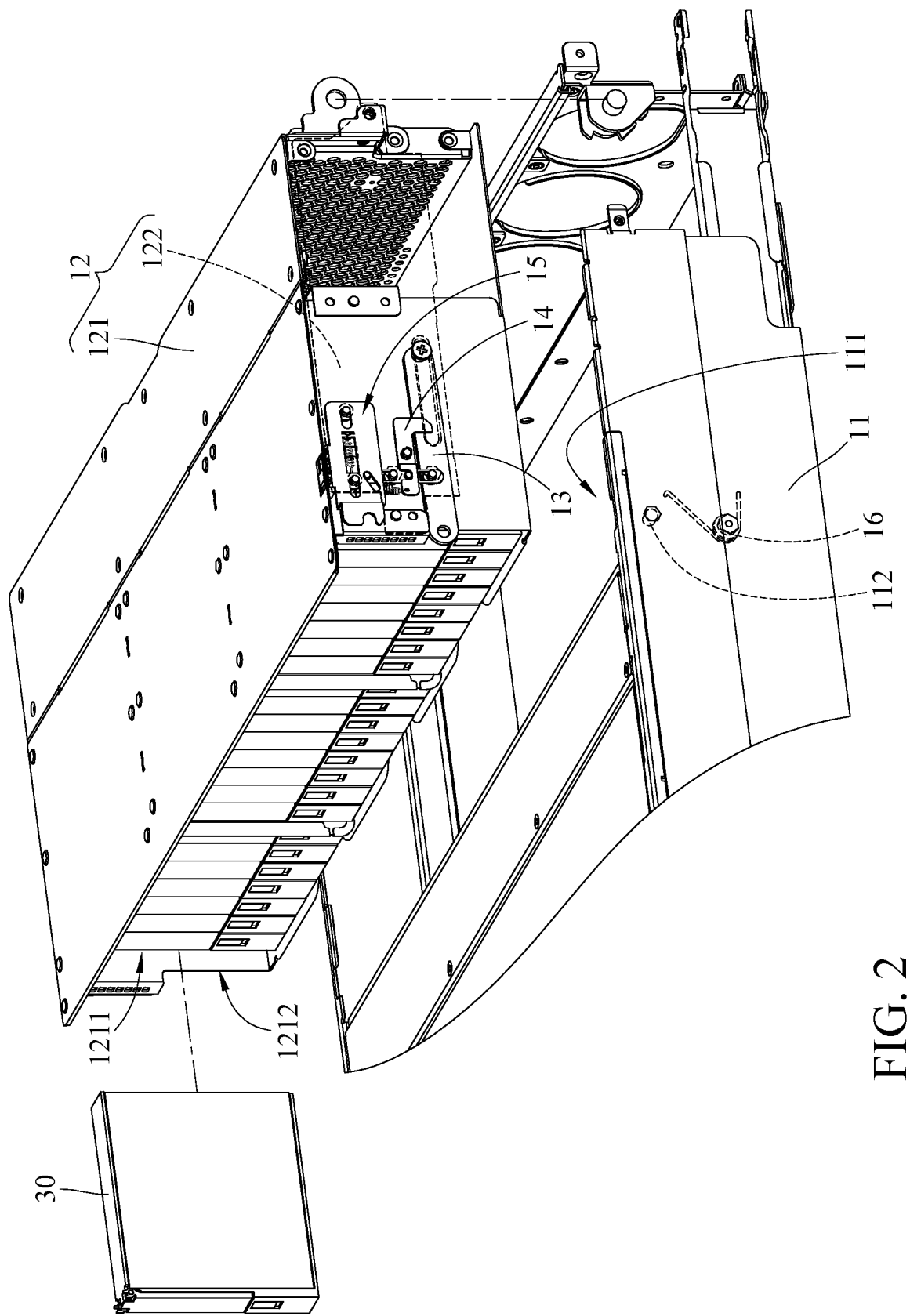
FIG. 2 is a partially exploded view of the electronic device in FIG. 1.
Figure 3:
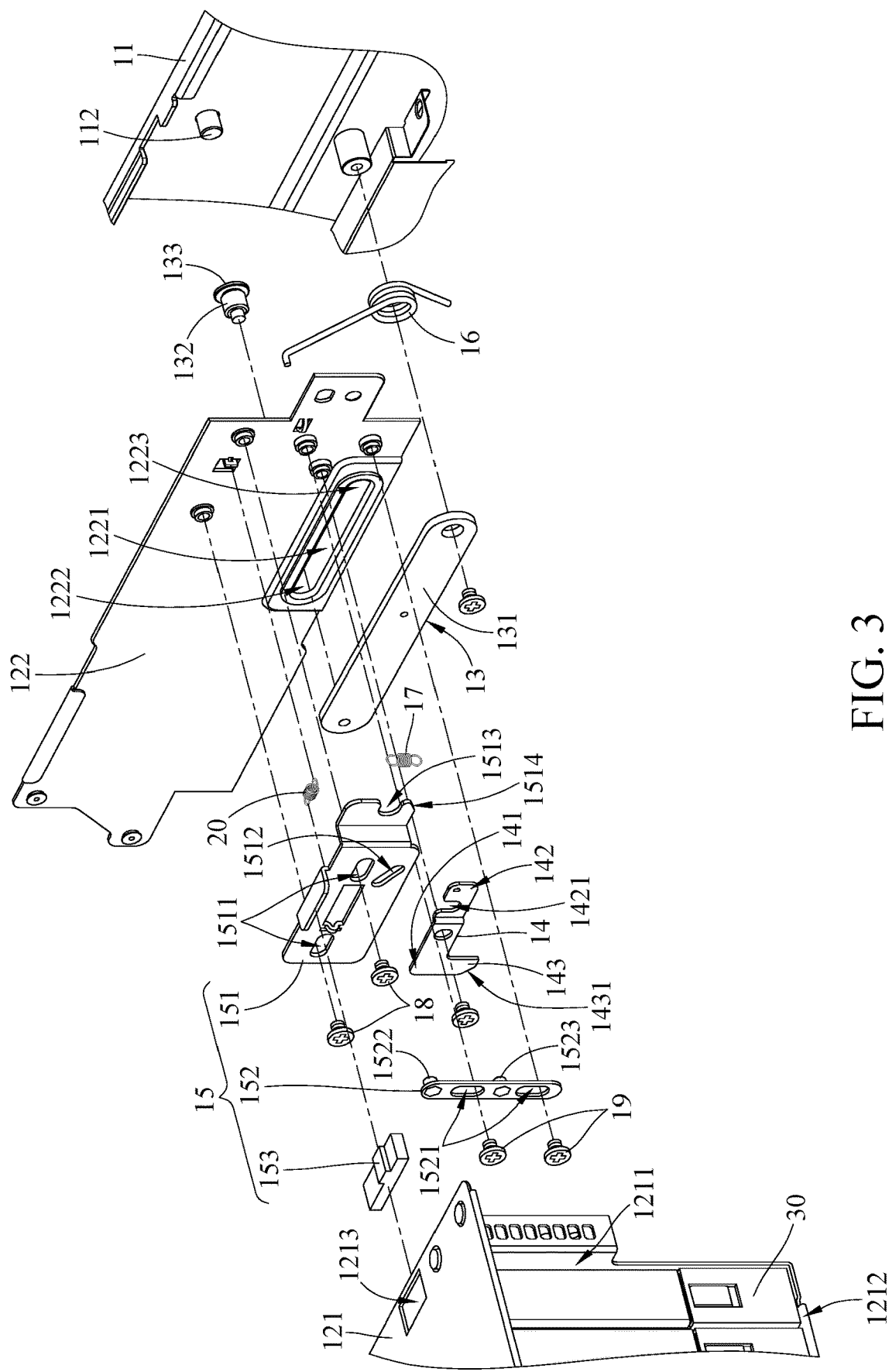
FIG. 3 is another partially exploded view of the electronic device in FIG. 1.

Referring to FIGS. 1 to 3, FIG. 1 is a partially perspective view of an electronic device 1 according to a first embodiment of the disclosure, FIG. 2 is a partially exploded view of the electronic device 1 in FIG. 1, and FIG. 3 is another partially exploded view of the electronic device 1 in FIG. 1.

In this embodiment, the electronic device 1 is, for example, a server. The electronic device 1 includes a casing assembly 10 and a plurality of electronic components 30. The casing assembly 10 includes a casing 11, a cage 12, a supporting component 13, an engagement component 14 and an operation assembly 15.

Walls (not given reference numerals) of the casing 11 surround an accommodation space 111. The cage 12 is located in the accommodation space 111 of the casing 11 and pivotably disposed in the casing 11 so as to be pivotable between a closed position (shown in FIG. 1) and an opened position (shown in FIG. 9). Specifically, the cage 12 includes a frame body 121 and a side cover 122. The frame body 121 is pivotably disposed in the casing 11 via, for example, a plunger (not shown), such that the cage 12 is pivotable about a rotation axis P via the plunger. The frame body 121 has an installation space 1211 and an opening 1212 communicating with each other. The installation space 1211 is formed and surrounded by side plates (not given reference numerals) of the frame body 121 for accommodating the electronic components 30. The electronic components 30 can be removed from the installation space 1211 through the opening 1212 or placed into the installation space 1211 through the opening 1212. The side cover 122 is fixed to one of the side plates of the frame body 121. The electronic components 30 are, for example, hard disk drives, but the disclosure is not limited thereto.

Figure 4:
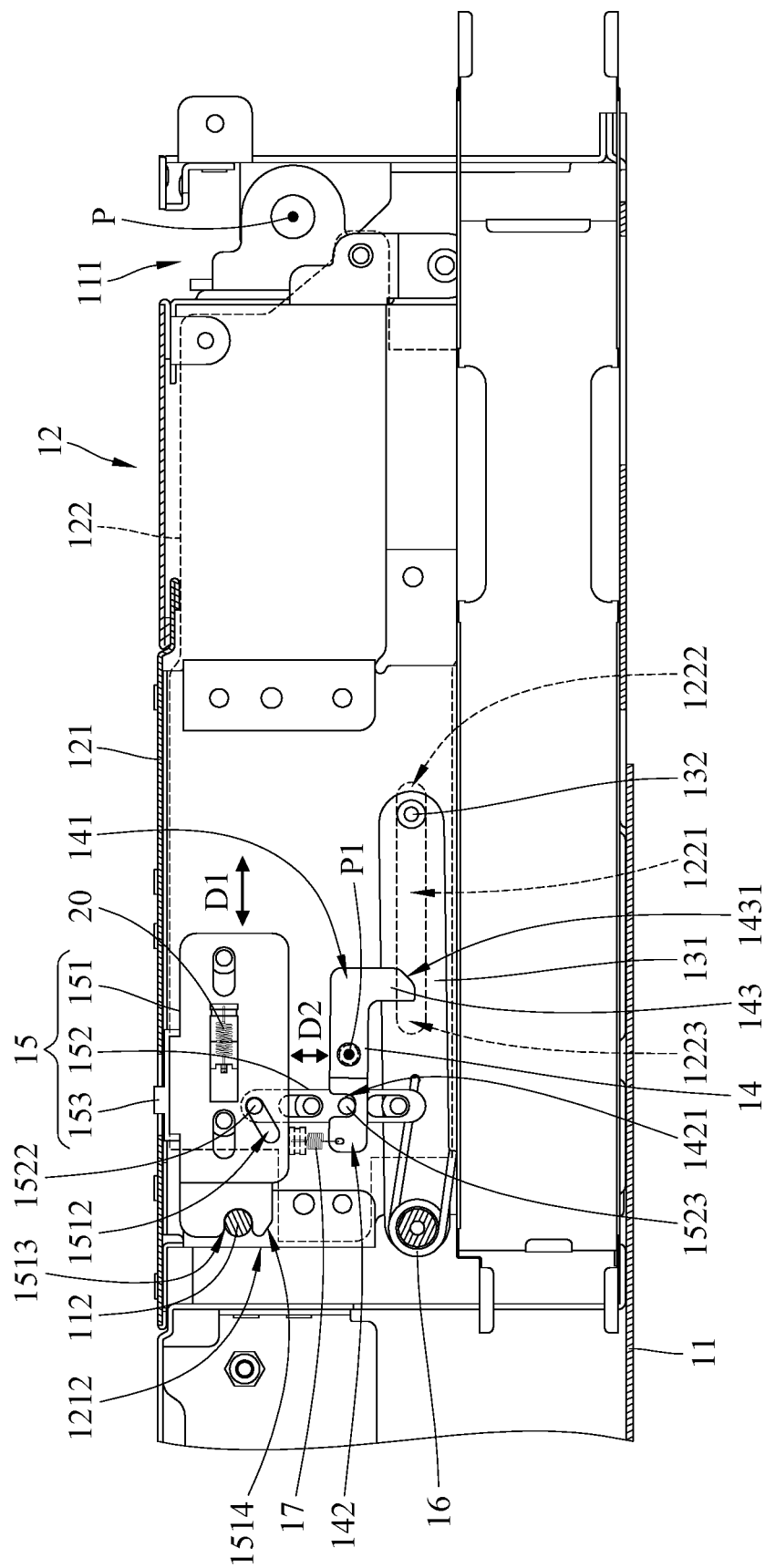
FIG. 4 is a partially cross-sectional view of the electronic device in FIG. 1.

Then, referring to FIGS. 2 to 4, FIG. 4 is a partially cross-sectional view of the electronic device 1 in FIG. 1.

The supporting component 13 is, for example, a link assembly. One end of the supporting component 13 is pivotably disposed on the casing 11, and another end of the supporting component 13 is slidably disposed on the side cover 122. Specifically, the side cover 122 has a guide hole 1221, and the guide hole 1221 is, for example, a through hole and has a first end 1222 and a second end 1223 located opposite to each other, and the first end 1222 is located closer to the rotation axis P of the cage 12 than the second end 1223. In addition, the supporting component 13 includes a link 131, a wheel 132 and a positioning component 133. An end of the link 131 is pivotably disposed on the casing 11, and the wheel 132 is rotatably disposed on another end of the link 131 via the positioning component 133. The positioning component 133, for example, serves as a shaft of the wheel 132 and is screwed into the link 131, such that the wheel 132 is positioned on the link 131 and rotatable relative to the link 131. The wheel 132 is partially and movably located in the guide hole 1221 of the side cover 122, and the wheel 132 is movable between the first end 1222 and the second end 1223 of the guide hole 1221. The wheel 132 can help the link 131 to be smoothly moved relative to the cage 12 during the rotation movement of the cage 12 relative to the casing 11.

Note that the guide hole 1221 of the side cover 122 is not restricted to being a through hole, and the wheel 132 and the positioning component 133 of the supporting component 13 are optional components; in some other embodiments, the guide hole of the side cover may not be a through hole but a groove, and the supporting component may be a slide block. In such a case, the cooperation of the guide hole and the slide block of the supporting component can also help the link to be moved smoothly relative to the cage.

In this embodiment, the casing assembly 10 may further include a torsion spring 16. Two opposite ends of the torsion spring 16 are respectively fixed to the casing 11 and the supporting component 13. The torsion spring 16 is used to force the supporting component 13 to pivot relative to the casing 11 for moving the cage 12 from the closed position toward the opened position selectively.

The engagement component 14 is pivotably disposed on the side cover 122 of the cage 12. The engagement component 14, for example, has a first end 141, a second end 142 and a hook structure 143. The first end 141 and the second end 142 of the engagement component 14 are respectively located two opposite sides of a rotation axis P1 of the engagement component 14. The hook structure 143 is located at the first end 141 of the engagement component 14. When the wheel 132 of the supporting component 13 is located at the second end 1223 of the guide hole 1221, the hook structure 143 is engaged with the wheel 132 of the supporting component 13 so as to fix the cage 12 in the opened position. The hook structure 143 has an inclined guide surface 1431. When the wheel 132 is moved from the first end 1222 toward the second end 1223 of the guide hole 1221, the inclined guide surface 1431 is pushed by the wheel 132, and the cage 12 is moved from the closed position toward the opened position.

In this embodiment, the casing assembly 10 may, for example, include a first elastic component 17. The first elastic component 17 is, for example, an extension spring. Two opposite ends of the first elastic component 17 are respectively fixed to the side cover 122 of the cage 12 and the second end 142 of the engagement component 14. The first elastic component 17 applies a force to the engagement component 14 to force the hook structure 143 to be located in a movement path of the supporting component 13 (e.g., a path between the first end 1222 and the second end 1223 of the guide hole 1221). Also, the first elastic component 17 can maintain the hook structure 143 to be engaged with the wheel 132 of the supporting component 13 when the wheel 132 of the supporting component 13 is located at the second end 1223 of the guide hole 1221.

The operation assembly 15 includes a latch component 151 and a connection component 152. The latch component 151 and the connection component 152 are slidably disposed on the side cover 122, and a slidable direction D1 of the latch component 151 is, for example, at an angle to a slidable direction D2 of the connection component 152. For example, the latch component 151 may have two first elongated through holes 1511, and the connection component 152 may have two second elongated through holes 1521. The casing assembly 10 may further include two first fasteners 18 and two second fasteners 19. The two first fasteners 18 are, for example, screws. The first fasteners 18 are respectively disposed through the two first elongated through holes 1511 and are screwed into the side cover 122, such that the latch component 151 is movable relative to the cage 12 along the direction D1. The second fasteners 19 are, for example, screws. The second fasteners 19 are respectively disposed through the second elongated through holes 1521 and are screwed into the side cover 122, such that the latch component 151 is movable relative to the cage 12 along the direction D2 that is, for example, perpendicular to the direction D1.

Note that the slidable direction D1 of the latch component 151 is not restricted to being perpendicular to the slidable direction D2 of the connection component 152; in some other embodiments, the slidable direction of the latch component and the slidable direction of the connection component may be at an angle other than a right angle.

In this embodiment, the latch component 151 may have an inclined guide slot 1512, and the connection component 152 may have a pushed protrusion 1522 and a pushing protrusion 1523. The pushed protrusion 1522 is located in the inclined guide slot 1512, and the pushing protrusion 1523 is in contact with a recess 1421 of the second end 142 of the engagement component 14.

In this embodiment, the operation assembly 15 may further include a slide knob 153, and the frame body 121 of the cage 12 may further have a through hole 1213. The slide knob 153 is disposed through the through hole 1213 and fixed to the latch component 151. The slide knob 153 is slidable to move the latch component 151. Note that the slide knob 153 may be an optional component; in some other embodiments, the operation assembly may not include the slide knob, and a protrusion structure may be provided to be integrally connected to the latch component and disposed through the through hole 1213 of the frame body 121 for being operated by a user.

In addition, the casing 11 may have a positioning structure 112, and the latch component 151 may have a positioning recess 1513. The positioning structure 112 is, for example, a protrusion and located in the accommodation space 111 of the casing 11. The positioning recess 1513 of the latch component 151 and the positioning structure 112 of the casing 11 are engaged with each other so as to keep the cage 12 to be in the closed position. In addition, the latch component 151 may further have an inclined contact surface 1514. The inclined contact surface 1514 is located close to the positioning recess 1513 and located farther away from the slide knob 153 than the positioning recess 1513. The inclined contact surface 1514 can be pushed by the positioning structure 112 of the casing 11 so as to move the latch component 151 away from the positioning structure 112.

In this embodiment, the casing assembly 10 may, for example, include a second elastic component 20. The second elastic component 20 is, for example, an extension spring. Two opposite ends of the second elastic component 20 are respectively fixed to the side cover 122 of the cage 12 and the latch component 151. The second elastic component 20 applies a force to the latch component 151 so as to keep the latch component 151 to be in a position where the positioning recess 1513 of the latch component 151 is engaged with the positioning structure 112 of the casing 11.

As shown in FIG. 4, when the cage 12 is in the closed position, the wheel 132 of the supporting component 13 is located at the first end 1222 of the guide hole 1221, the inclined guide surface 1431 of the hook structure 143 of the engagement component 14 is located between the first end 1222 and the second end 1223 of the guide hole 1221 and is located closer to the second end 1223 of the guide hole 1221, and the positioning recess 1513 of the latch component 151 remains engaged with the positioning structure 112 of the casing 11 by the second elastic component 20, such that the cage 12 is fixed in the closed position and is unable to be pivoted relative to the casing 11. At this moment, the opening 1212 of the frame body 121 of the cage 12 is located in the accommodation space 111 of the casing 11, and thus the user is unable to withdraw the electronic components 30 out of the cage 12 or place the electronic components 30 in the cage from the opening 1212 of the frame body 121 of the cage 12.

Figure 5:
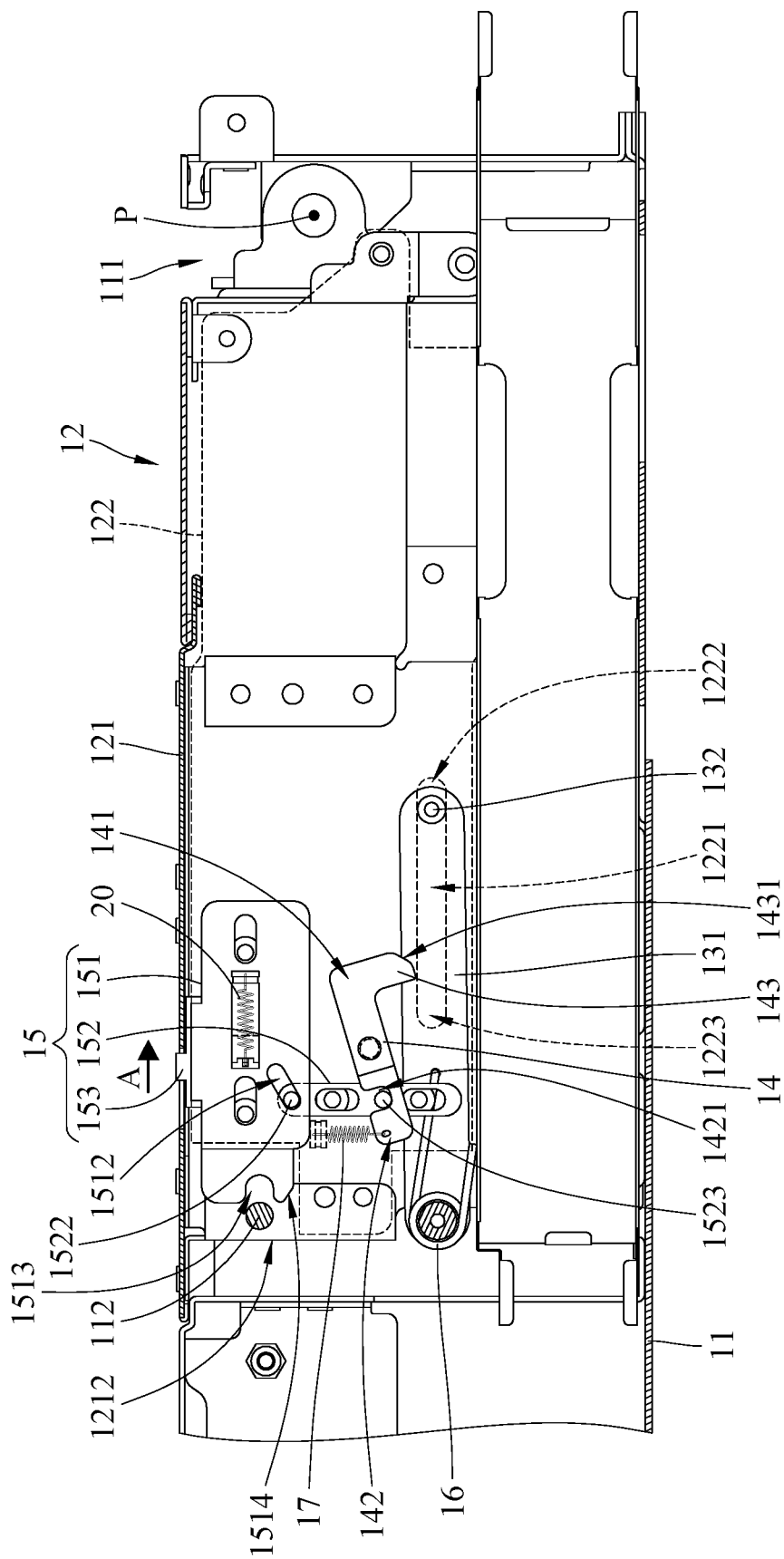
FIG. 5 is a partially cross-sectional view of the electronic device in FIG. 4 when a slide knob is operated.
Figure 6:
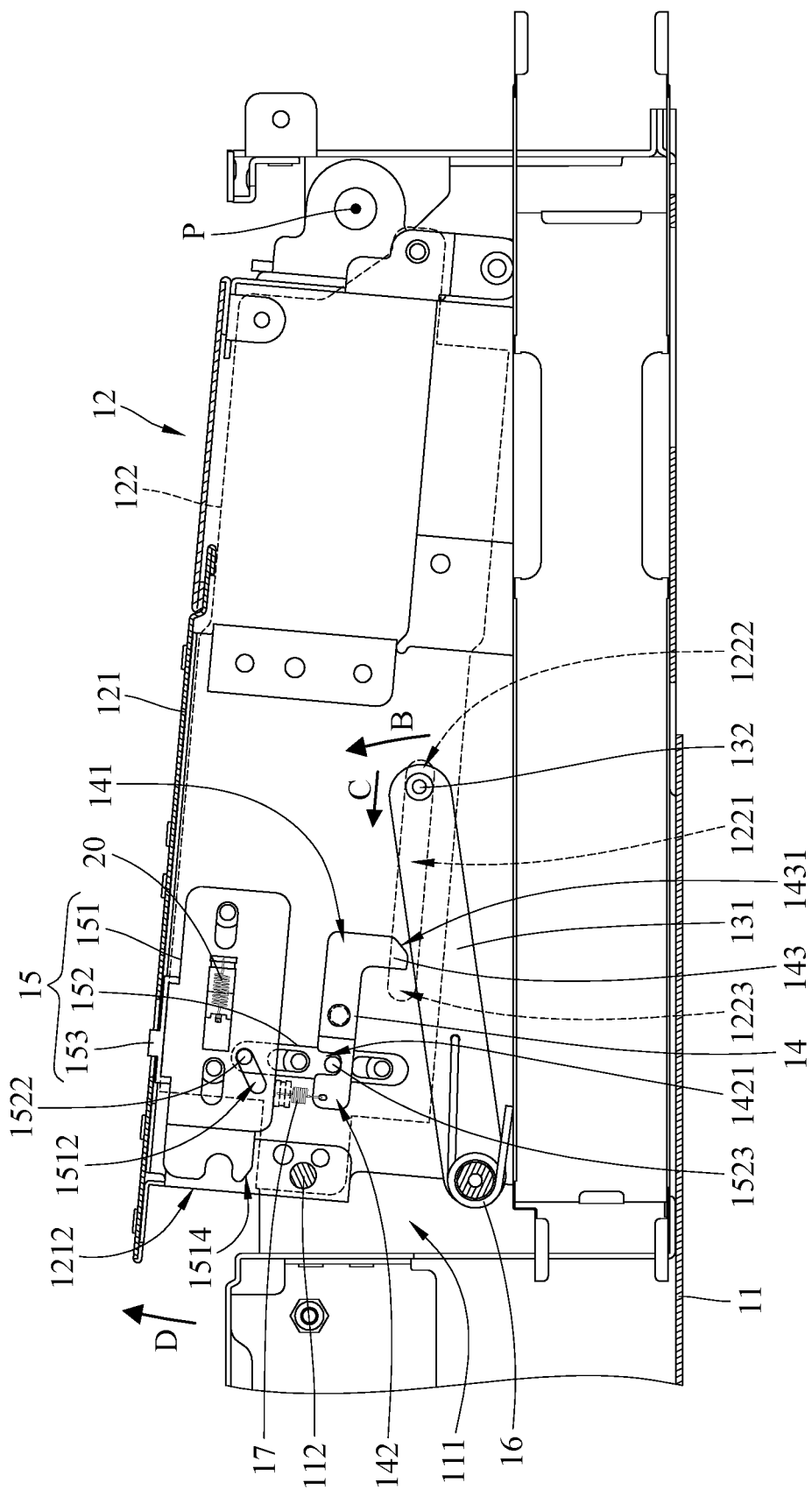
FIG. 6 is a partially cross-sectional view of the electronic device in FIG. 5 when a torsion spring lifts up a cage.

Then, referring to FIGS. 5 and 6, FIG. 5 is a partially cross-sectional view of the electronic device 1 in FIG. 4 when the slide knob 153 is operated, and FIG. 6 is a partially cross-sectional view of the electronic device 1 in FIG. 5 when the torsion spring 16 lifts up the cage 12.

When the electronic components 30 (shown in FIG. 2) are required to be withdrawn from the cage 12 or placed into the cage 12, the slide knob 153 is firstly moved along a direction A to drive the positioning recess 1513 of the latch component 151 to disengage from the positioning structure 112 of the casing 11. At this moment, the cage 12 is not fixed to the casing 11, and thus the torsion spring 16 forces the supporting component 13 to pivot along a direction B so as to move the wheel 132 of the supporting component 13 toward the second end 1223 from the first end 1222 of the guide hole 1221 along a direction C by a distance and drive the cage 12 to pivot relative to the casing 11 about the rotation axis P by an angle (e.g., along a direction D), such that the cage 12 is lifted up relative to the casing 11. As a result, the user can force the cage 12 to further lift up along the direction D for enabling the opening 1212 of the cage 12 to be completely moved out of the accommodation space 111 of the casing 11. Note that the torsion spring 16 is an optional component; in some other embodiments, the casing assembly may include a compression spring, and two opposite ends of the compression spring are respectively in contact with the bottom of the casing and the bottom of the cage. In such a case, when the positioning recess of the latch component is disengaged from the positioning structure of the casing, the compression spring can automatically lift up the cage relative to the casing. Alternatively, in another embodiment, the casing assembly may not include the torsion spring or the compression spring, and when the positioning recess of the latch component is disengaged from the positioning structure of the casing, the cage can be manually lifted up relative to the casing.

Figure 7:
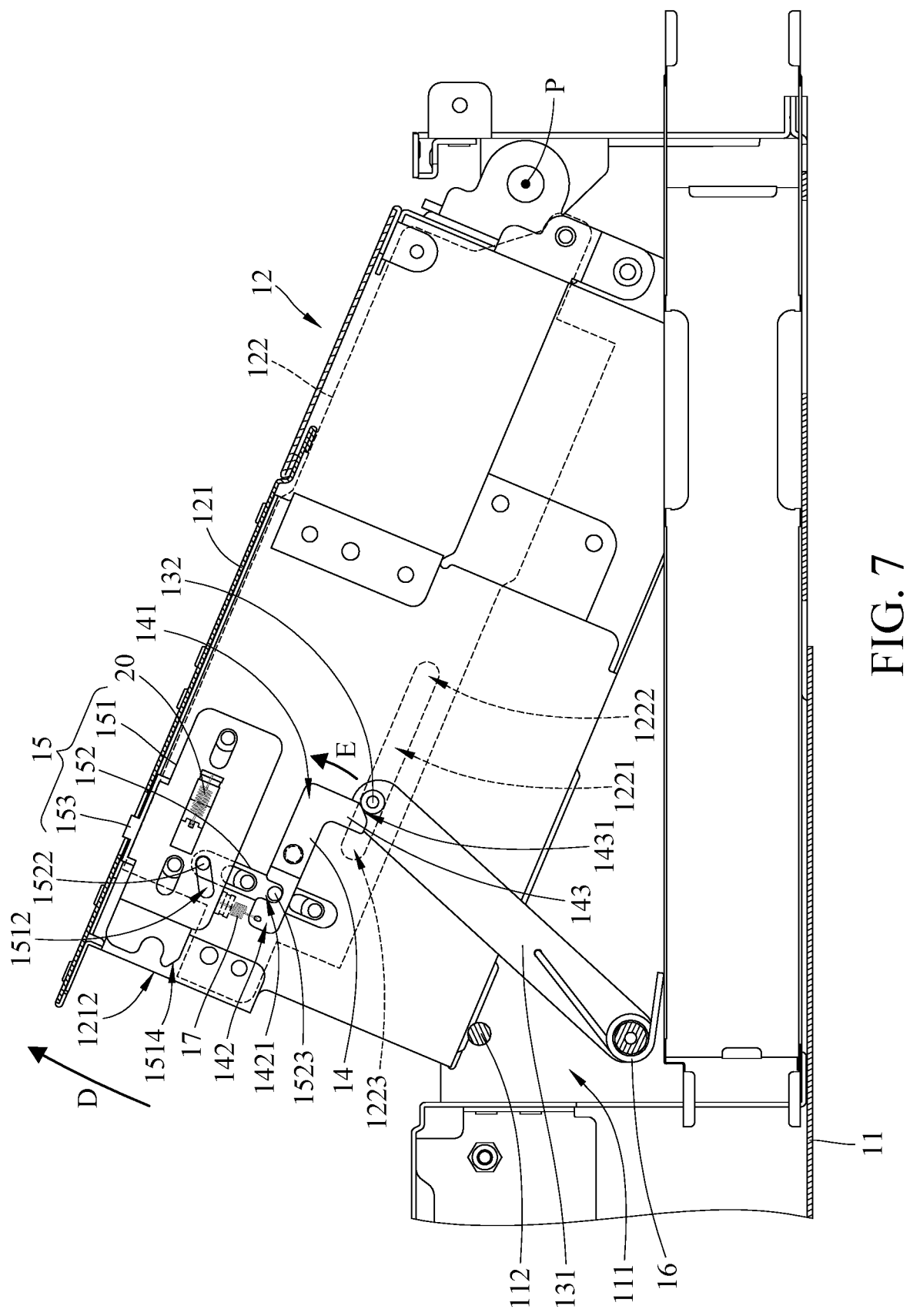
FIG. 7 is a partially cross-sectional view of the electronic device in FIG. 6 when the cage is pivoted relative to a casing.
Figure 8:
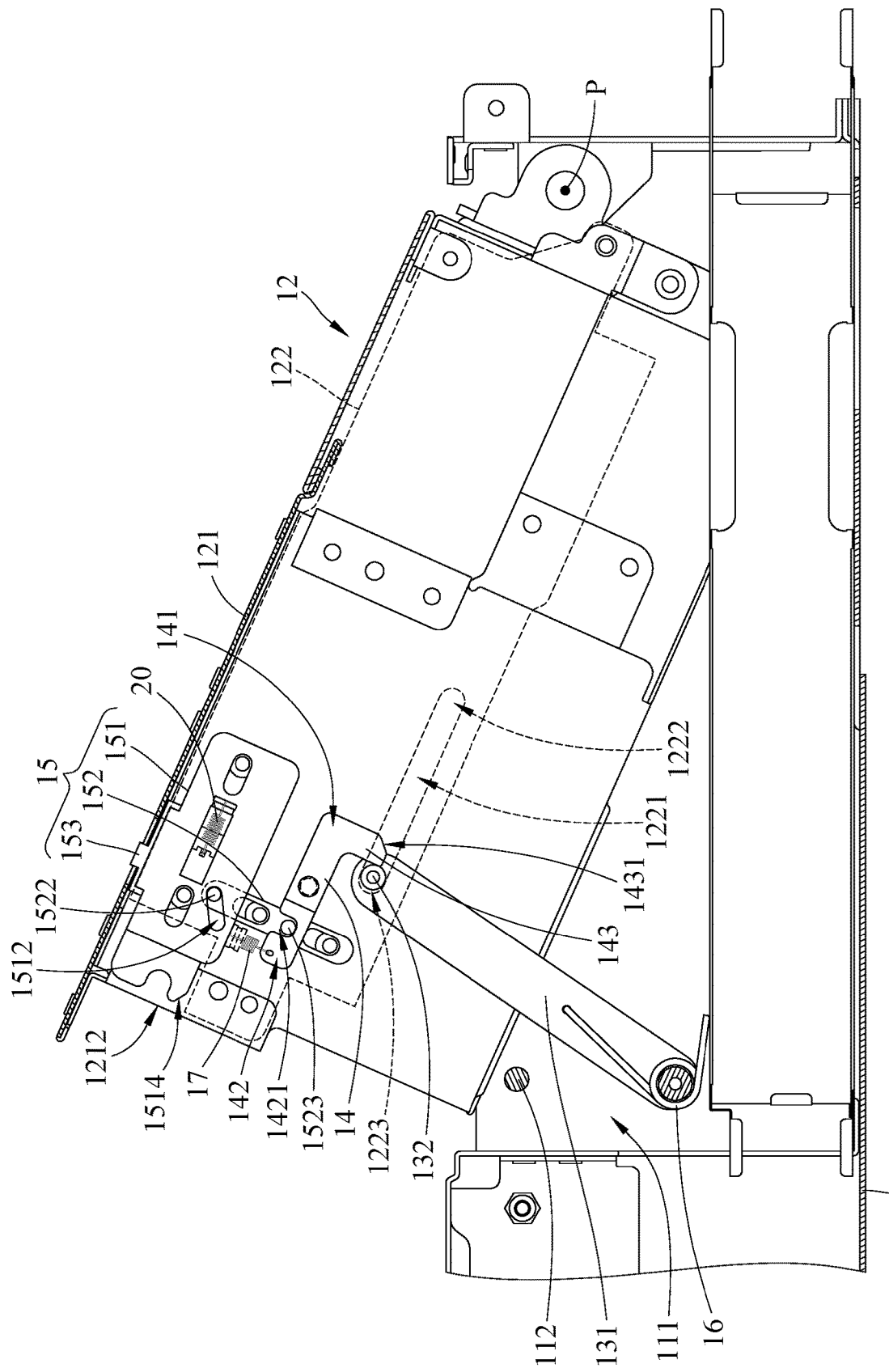
FIG. 8 is a partially cross-sectional view of the electronic device in FIG. 7 when an engagement component is engaged with a supporting component.
Figure 9:
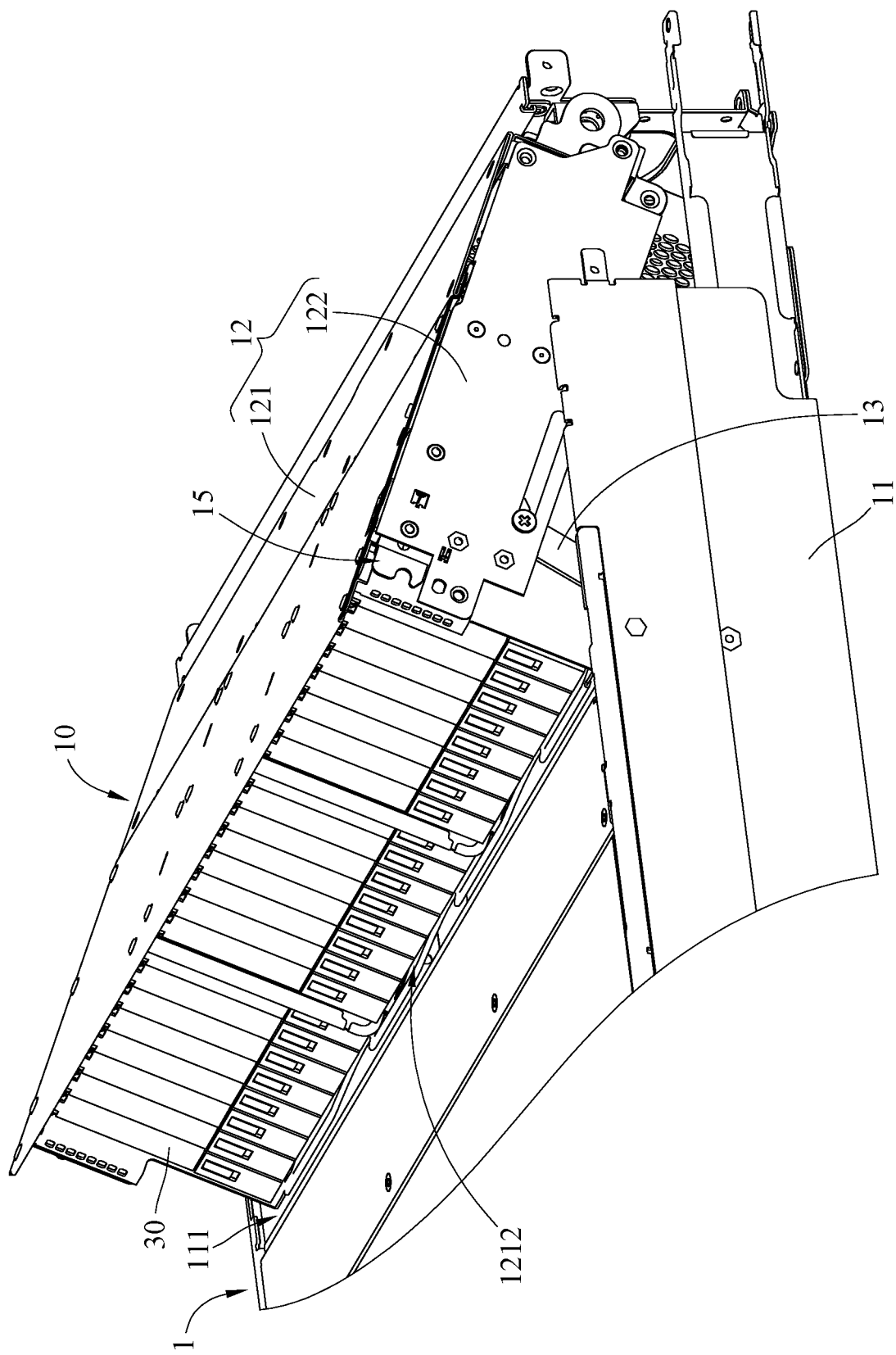
FIG. 9 is a partially perspective view of the electronic device in FIG. 1 when the casing is in an opened position.

Then, referring to FIGS. 7 to 9, FIG. 7 is a partially cross-sectional view of the electronic device 1 in FIG. 6 when the cage 12 is pivoted relative to the casing 11, FIG. 8 is a partially cross-sectional view of the electronic device 1 in FIG. 7 when the engagement component 14 is engaged with the supporting component 13, and FIG. 9 is a partially perspective view of the electronic device 1 in FIG. 1 when the casing 11 is in the opened position.

The user can manually pivot the entire cage 12 along the direction D by hand. During the movement of the cage 12 along the direction D, the wheel 132 of the supporting component 13 presses against the inclined guide surface 1431 of the hook structure 143 of the engagement component 14 so as to pivot the engagement component 14 along a direction E to leave the path where the wheel 132 is moved from the first end 1222 to the second end 1223 of the guide hole 1221 and stretch the first elastic component 17. After the wheel 132 of the supporting component 13 passes through the hook structure 143 of the engagement component 14, the first elastic component 17 forces the hook structure 143 to return its original position, such that the hook structure 143 of the engagement component 14 is engaged with the wheel 132 of the supporting component 13. As a result, the engagement component 14 holds the cage 12 to be in the opened position. At this moment, the opening 1212 of the cage 12 are exposed outside the accommodation space 111 of the casing 11, and thus the user can withdraw the electronic components 30 from the cage 12 or place the electronic components 30 into the cage 12 through the opening 1212 of the frame body 121 of the cage 12.

Figure 10:
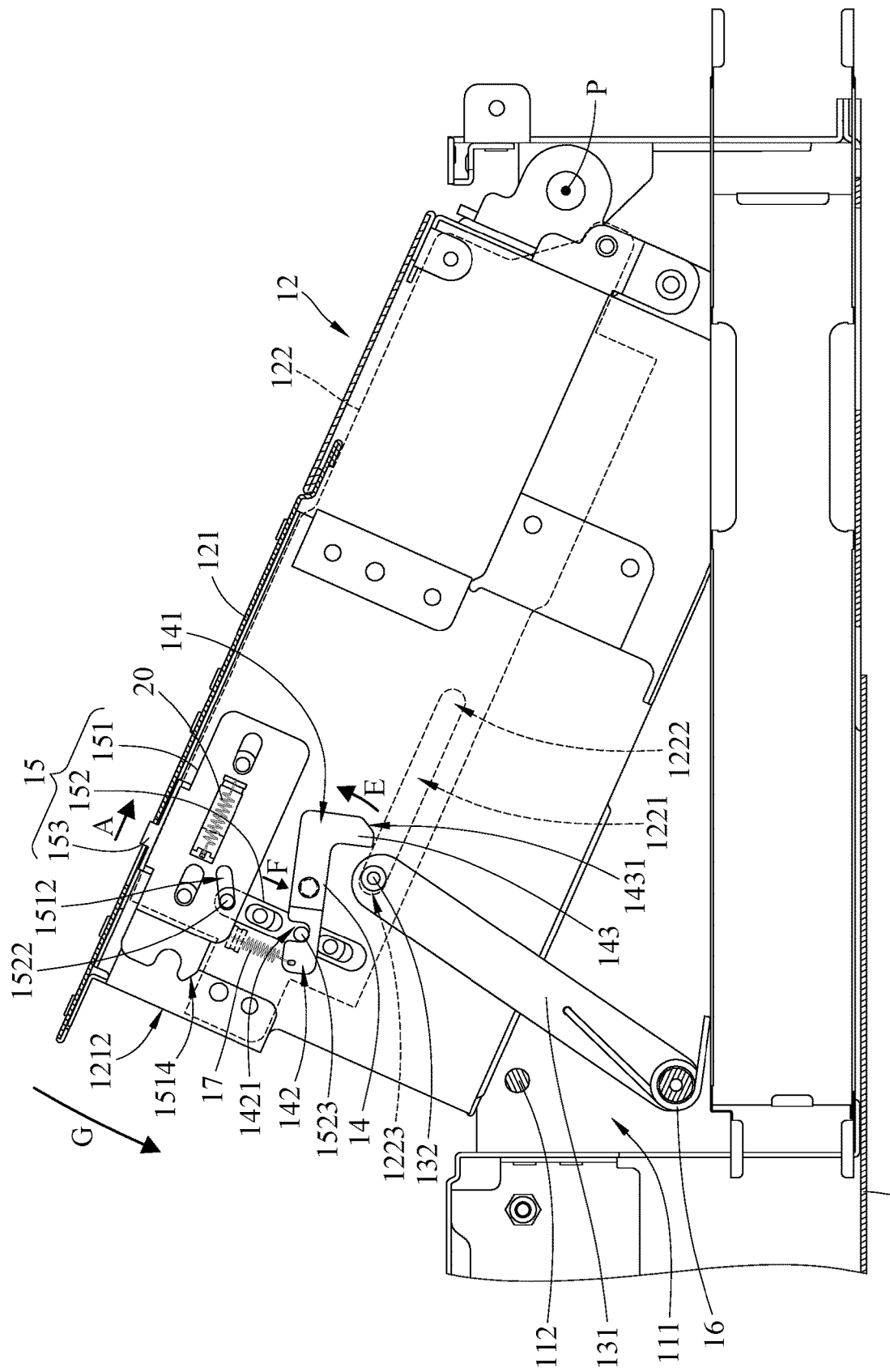
FIG. 10 is a partially cross-sectional view of the electronic device in FIG. 8 when the engagement component is disengaged from the supporting component.

Then, referring to FIG. 10, FIG. 10 is a partially cross-sectional view of the electronic device 1 in FIG. 8 when the engagement component 14 is disengaged from the supporting component 13.

When the cage 12 is required to be pivoted back to the closed position (as shown in FIG. 4) from the opened position, the engagement relationship between the hook structure 143 of the engagement component 14 and the wheel 132 of the supporting component 13 is required to be disengaged in advance. Specifically, the user can slide the slide knob 153 along the direction A to drive the latch component 151 to move along the direction A relative to the cage 12, such that the latch component 151 moves the connection component 152 along a direction F via the inclined guide slot 1512 and the pushed protrusion 1522 so as to force the pushing protrusion 1523 of the connection component 152 to push the recess 1421 of the engagement component 14, thereby driving the hook structure 143 of the engagement component 14 to disengage from the wheel 132 of the supporting component 13 along the direction E. As a result, the cage 12 is released from the opened position, and the user can press the cage 12 downwardly along a direction G so as to pivot the cage 12 to the closed position from the opened position. During the movement of the cage 12 from the opened position to the closed position, the inclined contact surface 1514 of the latch component 151 on the cage 12 presses against the positioning structure 112 of the casing 11 so as to move the latch component 151 along the direction A and stretch the second elastic component 20. When the user keeps pressing the cage 12 downwardly along the direction G, the inclined contact surface 1514 of the latch component 151 passes through the positioning structure 112, and the second elastic component 20 returns to its original position, such that the positioning recess 1513 of the latch component 151 and the positioning structure 112 of the casing 11 are engaged with each other so as to fix the cage 12 in the closed position.

In this embodiment, one end of the supporting component 13 is pivotably disposed on the casing 11, and another end of the supporting component 13 is slidably disposed on the cage 12, the engagement component 14 is pivotably disposed on the cage 12 and can be engaged with the supporting component 13 when the cage 12 is in the opened position, and the operation assembly 15 is movably disposed on the cage 12 and can drive the engagement component 14 to disengage from the supporting component 13, and thus in a case that there is no handle provided in the casing assembly 10, the cage 12 can still be fixed in the opened position or released from the opened position, while the appearance of the electronic device 1 can be maintained.

In this embodiment, the pushing protrusion 1523 of the connection component 152 is in contact with the recess 1421 of the second end 142 of the engagement component 14, but the disclosure is not limited thereto; in some other embodiments, the pushing protrusion of the connection component may be in contact with the first end of the engagement component, and the inclined guide slot of the latch component may extend toward another direction, such that the moving latch component can force the connection component to move upwardly via the inclined guide slot and the pushed protrusion so as to drive the hook structure of the engagement component to disengage from the wheel of the supporting component.

In this embodiment, one of the supporting component 13, the engagement component 14, one end of the first elastic component 17, the latch component 151, the connection component 152 and one end of the second elastic component 20 are all disposed on the side cover 122, but the disclosure is not limited thereto; in some other embodiments, the cage may not include the side cover, and the aforementioned components are disposed on the frame body of the cage.

In this embodiment, the latch component 151 is directly disengaged from the positioning structure 112 of the casing 11 by operating the slide knob 153 to slide the latch component 151, and the engagement component 14 is disengaged from the supporting component 13 by operating the slide knob 153 to drive the latch component 151 to slide the connection component 152, but the disclosure is not limited thereto.

Figure 11:
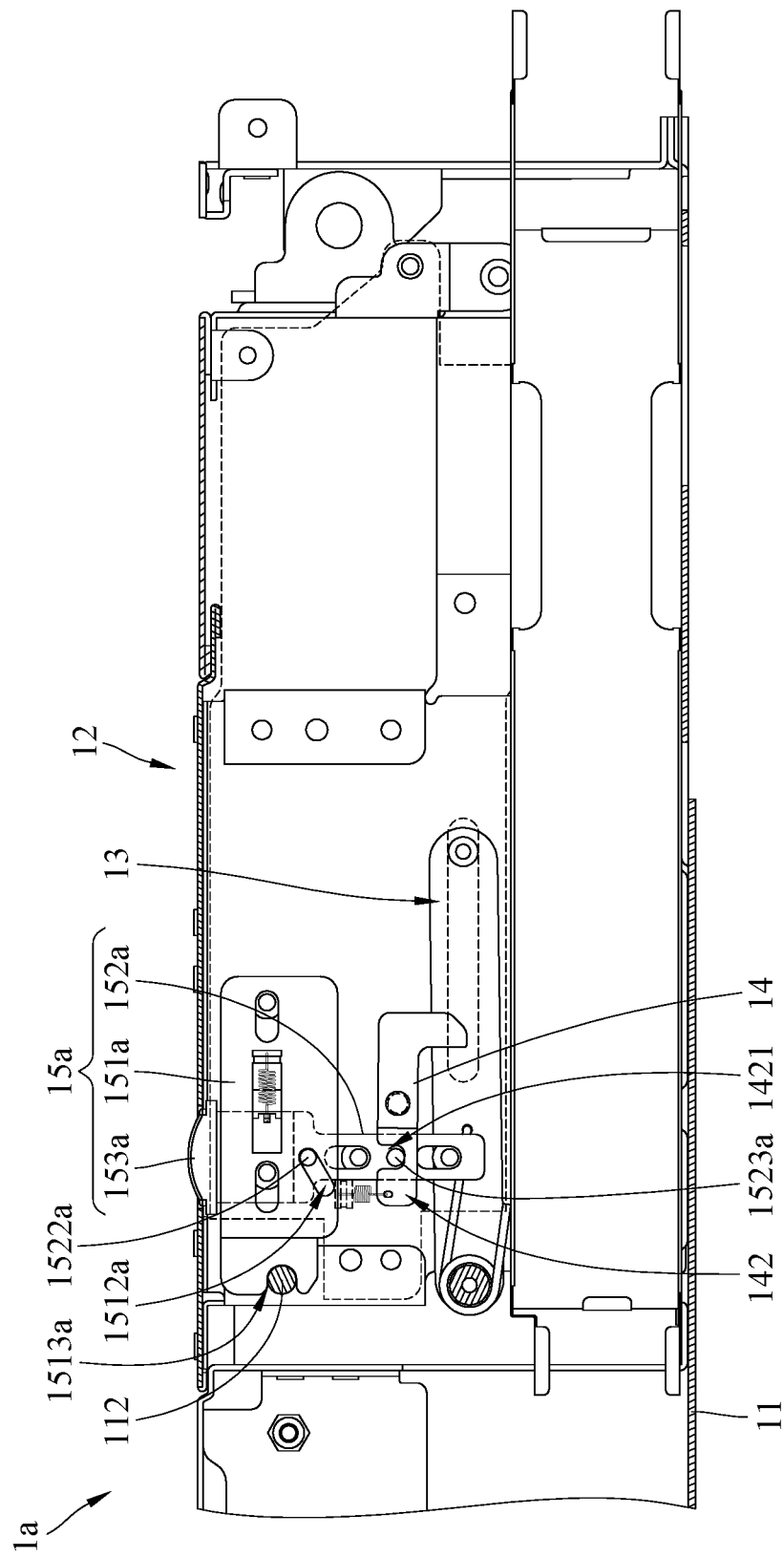
FIG. 11 is a partially cross-sectional view of an electronic device according to a second embodiment of the disclosure.
Figure 12:
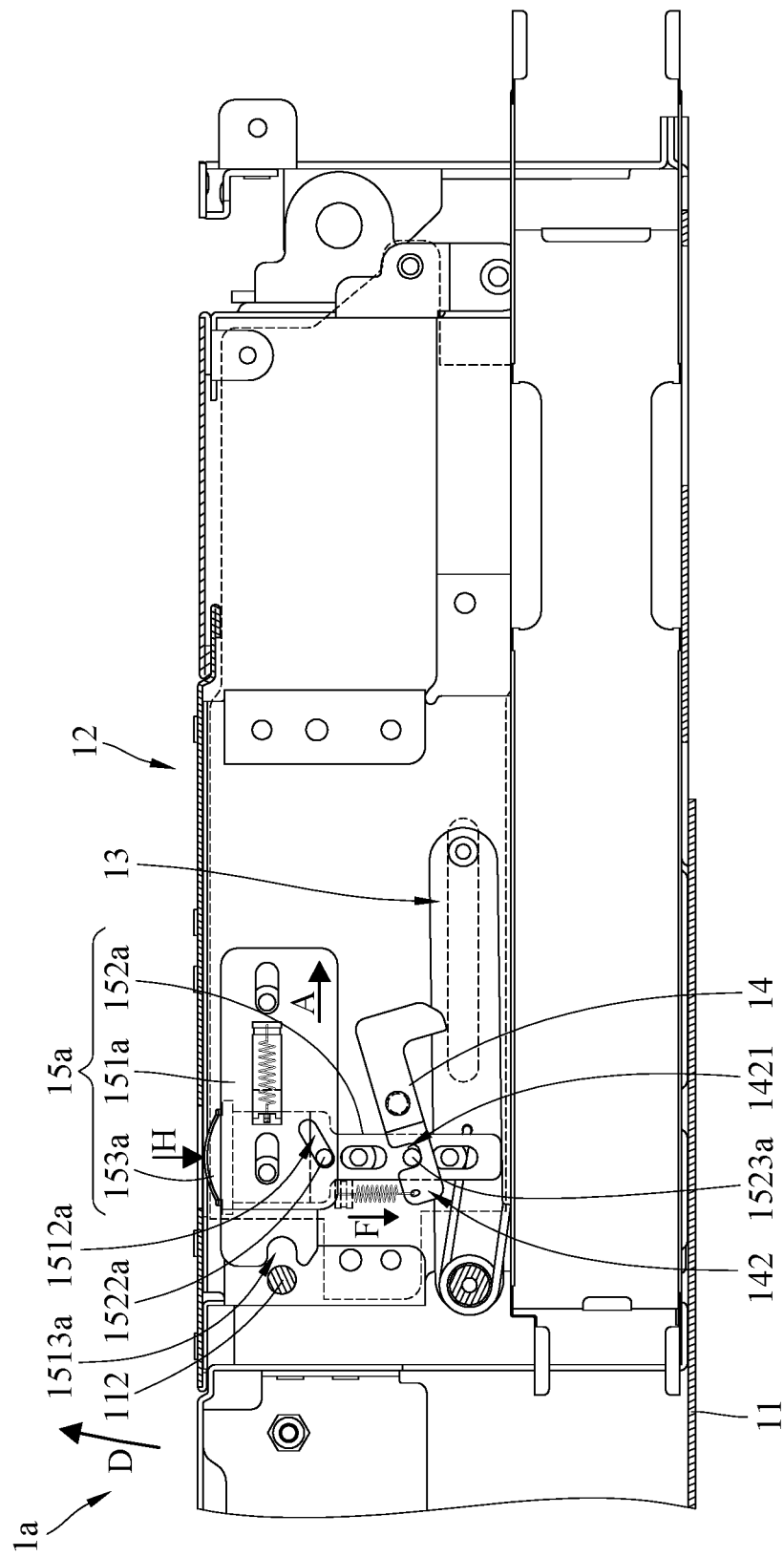
FIG. 12 is a partially cross-sectional view of the electronic device in FIG. 11 when a button is pressed.

Referring to FIGS. 11 and 12, FIG. 11 is a partially cross-sectional view of an electronic device 1a according to a second embodiment of the disclosure, and FIG. 12 is a partially cross-sectional view of the electronic device 1a in FIG. 11 when a button 153a is pressed.

The electronic device 1a of this embodiment is similar to the electronic device 1 shown in FIGS. 1 to 10 of the previous embodiment, the main difference between them is the movement relationship between the latch component and the connection component, and thus the following paragraphs will mainly introduce the difference between them, while other parts of this embodiment can be referred to the previous paragraphs related to the electronic device 1 and will not repeatedly introduced hereinafter.

In this embodiment, an operation assembly 15a does not include the slide knob, but include a button 153a, and the button 153a is fixed to a latch component 151a. The latch component 151a has an inclined guide slot 1512a, and a connection component 152a has a first pushing protrusion 1522a and a second pushing protrusion 1523a. The first pushing protrusion 1522a is located in the inclined guide slot 1512a, and the second pushing protrusion 1523a is in contact with the recess 1421 of the second end 142 of the engagement component 14.

As shown in FIGS. 11 and 12, in a case that the cage 12 is in the closed position, and the positioning recess 1513a of the latch component 151a is engaged with the positioning structure 112 of the casing 11, the button 153a can be pressed along a direction H to force the connection component 152a to slide relative to the cage 12 along the direction F so as to drive the latch component 151a to move along the direction A via the first pushing protrusion 1522a and the inclined guide slot 1512a for disengaging the positioning recess 1513a of the latch component 151a from the positioning structure 112 of the casing 11. As a result, the cage 12 can be pivoted to the closed position from the opened position along the direction D.

Figure 13:
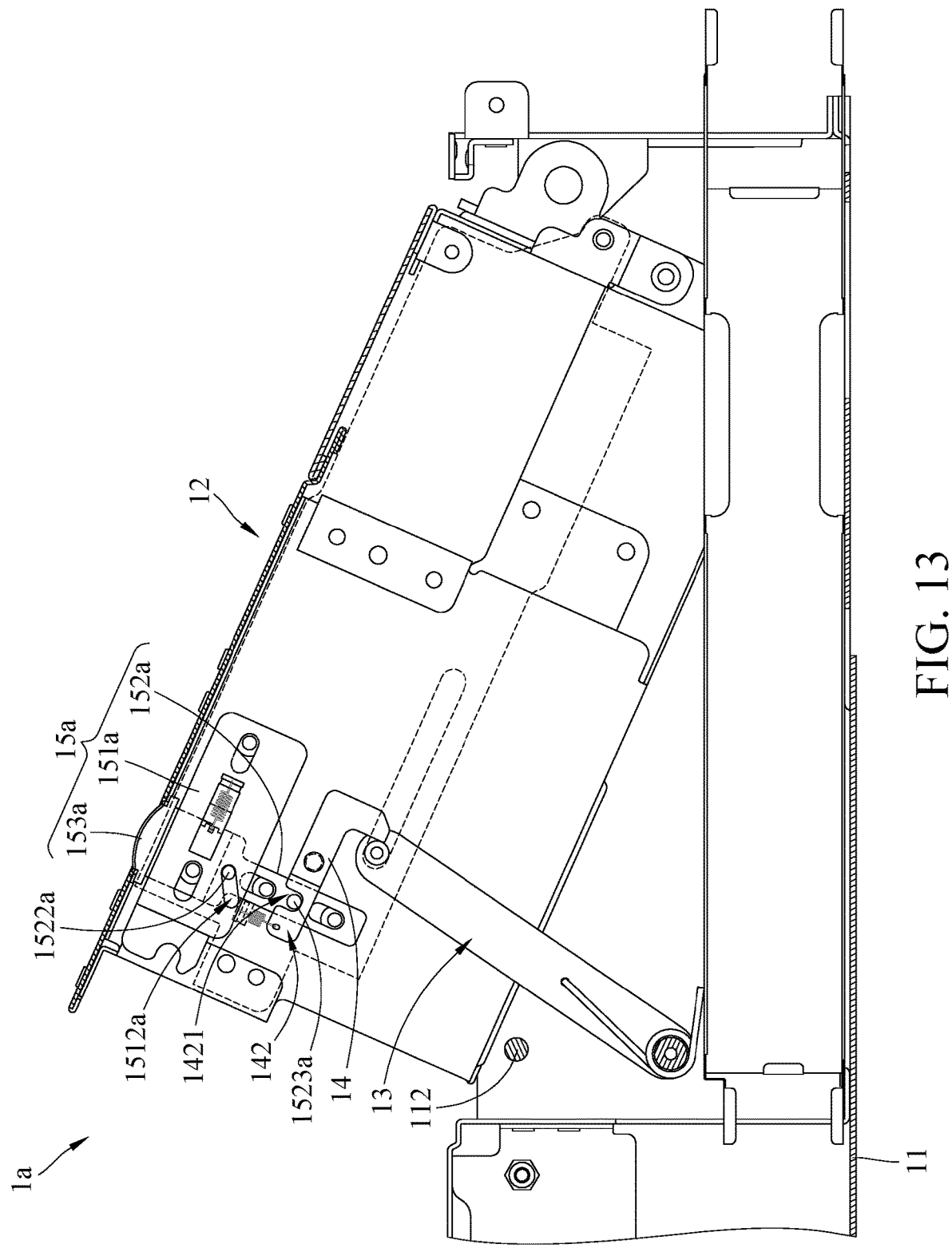
FIG. 13 is a partially cross-sectional view of the electronic device in FIG. 11 when an engagement component is engaged with a supporting component.
Figure 14:
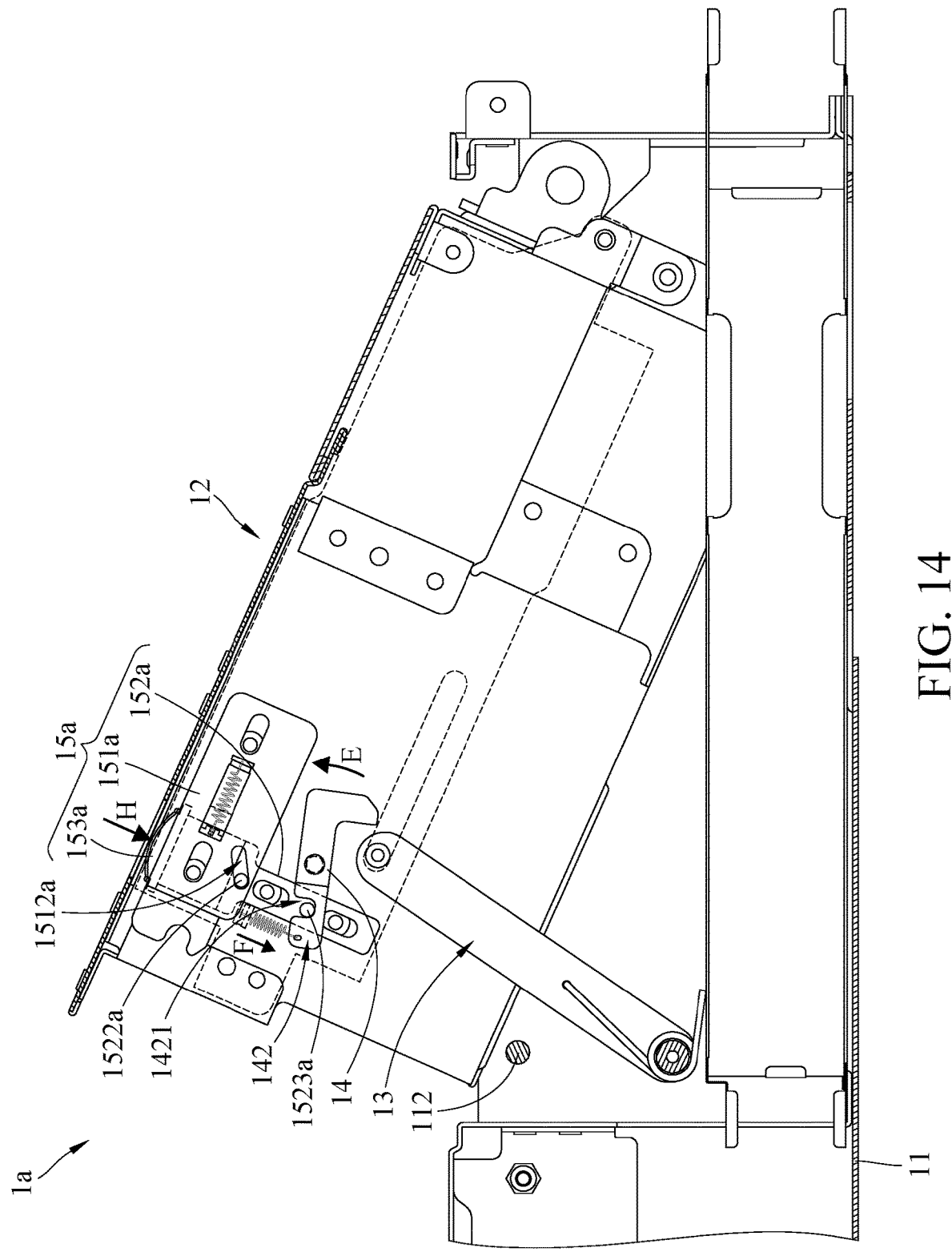
FIG. 14 is a partially cross-sectional view of the electronic device in FIG. 13 when the engagement component is disengaged from the supporting component.

Then, referring to FIGS. 13 and 14, FIG. 13 is a partially cross-sectional view of the electronic device 1 in FIG. 11 when the engagement component 14 is engaged with a supporting component 13, and FIG. 14 is a partially cross-sectional view of the electronic device 1 in FIG. 13 when the engagement component 14 is disengaged from the supporting component 13.

As shown in FIGS. 13 and 14, in a case that the cage 12 is in the opened position, and the engagement component 14 is engaged with the supporting component 13, the button 153a can be pressed along the direction H to force the connection component 152a to slide relative to cage 12 along the direction F so as to pivot the engagement component 14 along the direction E via the second pushing protrusion 1523a for disengaging the engagement component 14 from the supporting component 13. As a result, the cage 12 can be pivoted to the closed position from the opened position.

In this embodiment, the operation assembly 15a includes the latch component 151a, the connection component 152a and the button 153a, but the disclosure is not limited thereto; in some other embodiments, the operation assembly may not include the latch component, but include the connection component and the button, and the casing may not have the positioning structure. In such a case, the cage in the closed position can be fixed to the casing via other suitable components or structures. On the other hand, in another embodiment, the operation assembly may merely include the latch component and the slide knob. For example, referring to FIGS. 15 and 16, FIG. 15 is a partially cross-sectional view of an electronic device 1 according to a third embodiment of the disclosure, and FIG. 16 is a partially cross-sectional view of the electronic device 1 in FIG. 15 when a slide knob 153b is operated.

The electronic device 1b of this embodiment is similar to the electronic device 1 shown in FIGS. 1 to 10 of the previous embodiment, the main difference between them is the structure of the operation assembly, and thus the following paragraphs will mainly introduce the difference between them, while other parts of this embodiment can be referred to the previous paragraphs related to the electronic device 1 and will not repeatedly introduced hereinafter.

In this embodiment, an operation assembly 15b does not include the connection component, and a latch component 151b of the operation assembly 15b includes a main portion 1511b and a pushing portion 1512b connected to each other. The main portion 1511b of the latch component 151b has a positioning recess 15111b, and the positioning recess 15111b is used to be engaged with the positioning structure 112 of the casing 11. The engagement component 14b has a first inclined surface 144b, and the pushing portion 1512b has a second inclined surface 15121b, and the second inclined surface 15121b is in contact with the first inclined surface 144b. The slide knob 153b is fixed to the main portion 1511b of the latch component 151b.

Figure 15:
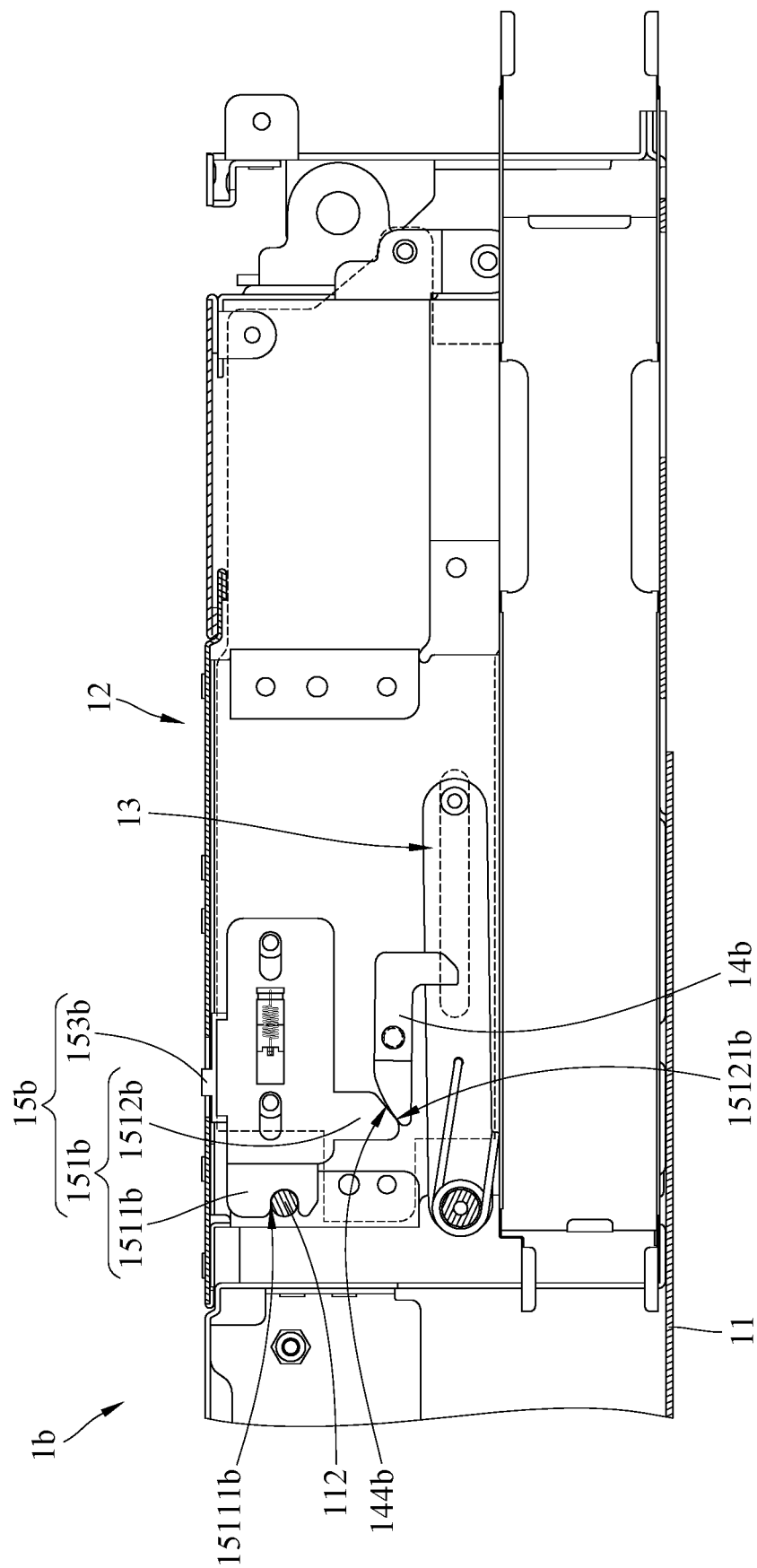
FIG. 15 is a partially cross-sectional view of an electronic device according to a third embodiment of the disclosure.
Figure 16:
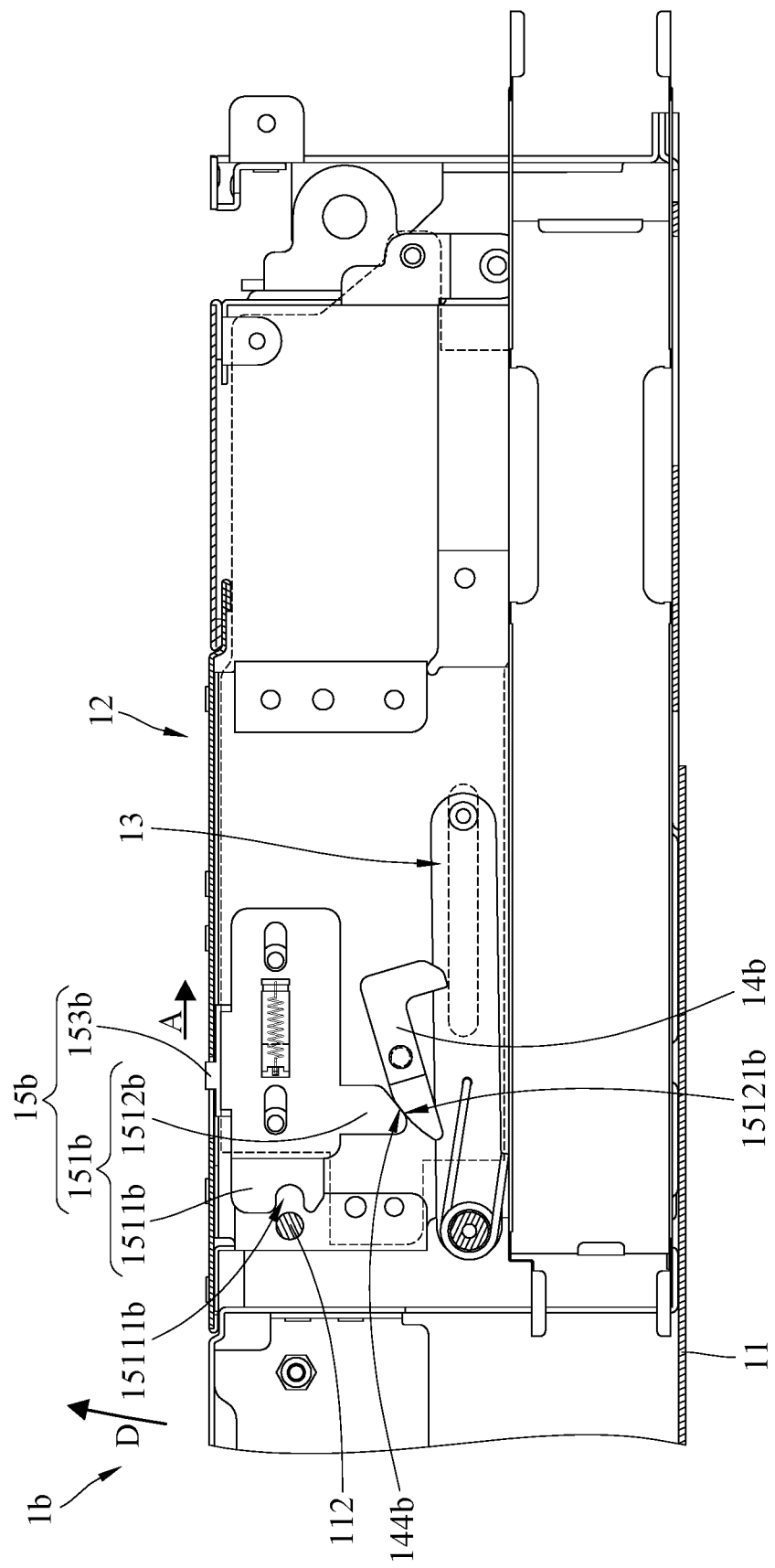
FIG. 16 is a partially cross-sectional view of the electronic device in FIG. 15 when a slide knob is operated.

As shown in FIGS. 15 and 16, in a case that the cage 12 is in the closed position, and the positioning recess 15111b of the latch component 151b is engaged with the positioning structure 112 of the casing 11, the slide knob 153b can be moved along the direction A to move the latch component 151b relative to the cage 12 for disengaging the positioning recess 15111b of the main portion 1511b of the latch component 151b from the positioning structure 112 of the casing 11. As a result, the cage 12 can be pivoted to the opened position to the closed position along the direction D.

Figure 17:
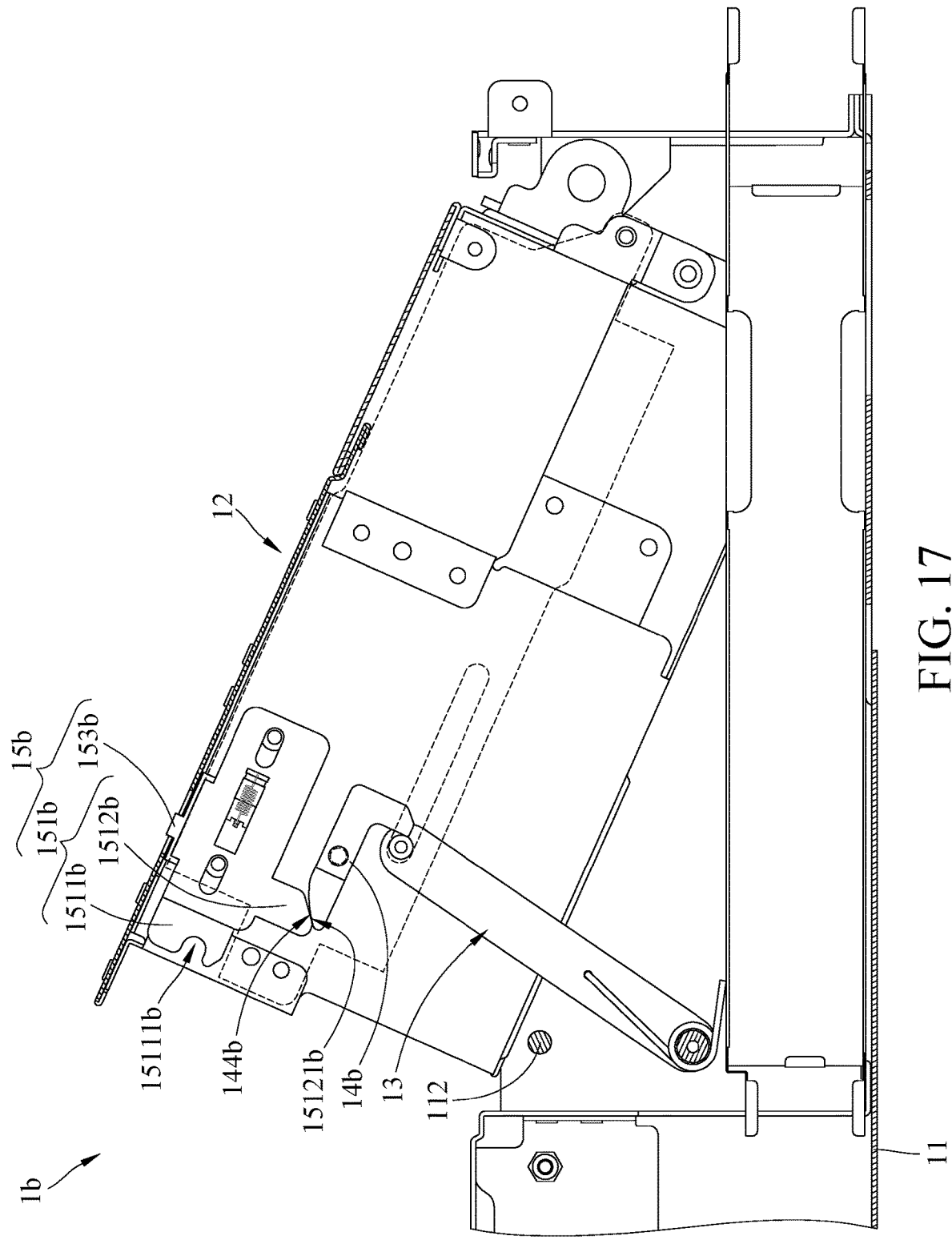
FIG. 17 is a partially cross-sectional view of the electronic device in FIG. 15 when an engagement component is engaged with a supporting component.
Figure 18:
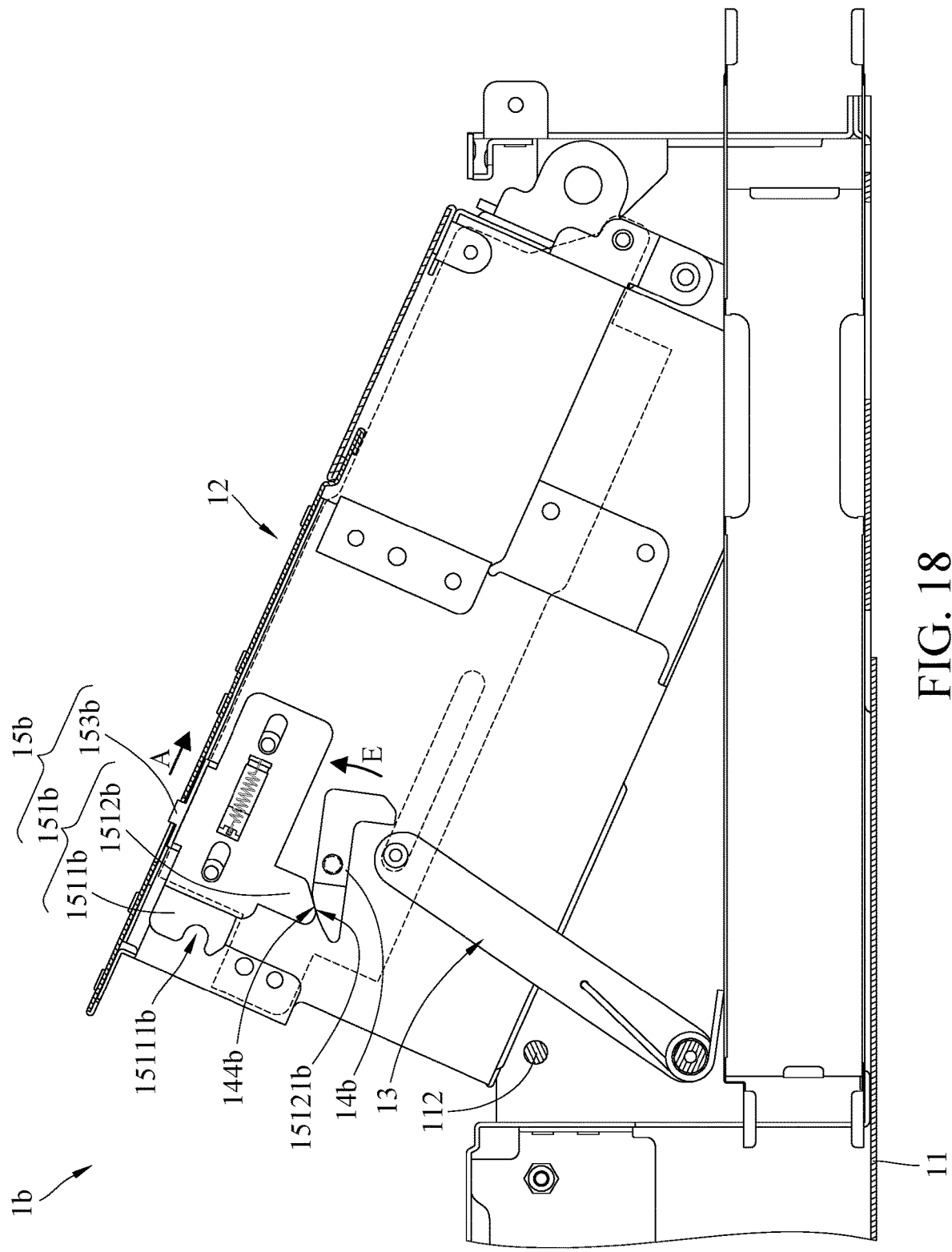
FIG. 18 is a partially cross-sectional view of the electronic device in FIG. 17 when the engagement component is disengaged from the supporting component.

Then, referring to FIGS. 17 and 18, FIG. 17 is a partially cross-sectional view of the electronic device 1 in FIG. 15 when the engagement component 14b is engaged with the supporting component 13, and FIG. 18 is a partially cross-sectional view of the electronic device 1 in FIG. 17 when the engagement component 14b is disengaged from the supporting component 13.

As shown in FIGS. 17 and 18, in a case that the cage 12 is in the opened position, and the engagement component 14b is engaged with the supporting component 13, the slide knob 153b can be moved along the direction A to move the latch component 151b relative to the cage 12 so as to force the pushing portion 1512b to pivot the engagement component 14b along the direction E via the first inclined surface 144b and the second inclined surface 15121b for disengaging the engagement component 14b from the supporting component 13.

According to the casing assemblies and the electronic devices as discussed in the above embodiments, one end of the supporting component is pivotably disposed on the casing, and another end of the supporting component is slidably disposed on the cage, the engagement component is pivotably disposed on the cage and can be engaged with the supporting component when the cage is in the opened position, and the operation assembly is movably disposed on the cage and can drive the engagement component to disengage from the supporting component, and thus in a case that there is no handle provided in the casing assembly, the cage can still be fixed in the opened position or released from the opened position, while the appearance of the electronic device can be maintained.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:
1. A casing assembly, comprising:
a casing;
a cage, movably disposed in the casing;
a supporting component, wherein one end of the supporting component is pivotably disposed on the casing, and another end of the supporting component is slidably disposed on the cage;
an engagement component, pivotably disposed on the cage and selectively engaged with the supporting component to position the cage; and
an operation assembly, movably disposed on the cage and connected to the engagement component, wherein the operation assembly is movable relative to the cage, and the engagement component is driven to disengage from the supporting component via the operation assembly selectively.

2. The casing assembly according to claim 1, wherein the operation assembly comprises a latch component and a connection component, the latch component and the connection component are slidably disposed on the cage, and the latch component is connected to the engagement component via the connection component.

3. The casing assembly according to claim 2, wherein a slidable direction of the latch component is different from a slidable direction of the connection component.

4. The casing assembly according to claim 2, wherein the casing has a positioning structure, and the latch component is selectively meshed with the positioning structure to position the cage.

5. The casing assembly according to claim 2, wherein the latch component has a inclined guide slot, the connection component has a pushed protrusion and a pushing protrusion, the pushed protrusion is disposed in the inclined guide slot, the pushing protrusion is in contact with the engagement component; the pushed protrusion of the connection component is selectively pushed by the inclined guide slot of the latch component, and the engagement component is selectively driven to disengage from the supporting component via the pushing protrusion of the connection component.

6. The casing assembly according to claim 2, wherein the operation assembly further comprises a slide knob, and the slide knob is fixed to the latch component.

7. The casing assembly according to claim 2, wherein the operation assembly further comprises a button, and the button is fixed to the connection component.

8. The casing assembly according to claim 7, wherein the latch component has an inclined guide slot, the connection component has a first pushing protrusion and a second pushing protrusion, the first pushing protrusion is disposed in the inclined guide slot, the second pushing protrusion is in contact with the engagement component; the inclined guide slot of the latch component is selectively pushed by the button via the first pushing protrusion, and the engagement component is driven to disengage from the supporting component via the second pushing protrusion selectively.

9. The casing assembly according to claim 1, wherein the operation assembly comprises a latch component, the latch component comprises a main portion and a pushing portion connected to each other, the engagement component has a first inclined surface, the pushing portion has a second inclined surface; the first inclined surface of the engagement component is selectively pushed by the second inclined surface of the pushing portion of the latch component, and the engagement component is driven to disengaged from the supporting component selectively.

10. The casing assembly according to claim 9, wherein the operation assembly further comprises a slide knob, and the slide knob is fixed to the main portion of the latch component.

11. The casing assembly according to claim 1, wherein the cage further has a guide hole, the supporting component comprises a link and a wheel, one end of the link is pivotably disposed on the casing, the wheel is rotatably disposed on another end of the link, and the wheel is partially and movably located in the guide hole.

12. The casing assembly according to claim 1, further comprising a torsion spring, wherein two opposite ends of the torsion spring are respectively fixed to the casing and the supporting component.

13. An electronic device, comprising:
   a casing assembly, comprising:
      a casing;
      a cage, movably disposed in the casing;
      a supporting component, wherein one end of the supporting component is pivotably disposed on the casing, and another end of the supporting component is slidably disposed on the cage;
      an engagement component, pivotably disposed on the cage and selectively engaged with the supporting component to position the cage;
      an operation assembly, movably disposed on the cage and connected to the engagement component, wherein the operation assembly is movable relative to the cage, and the engagement component is driven to disengage from the supporting component via the operation assembly selectively; and
   a plurality of electronic components, removably accommodated in the cage.

14. The electronic device according to claim 13, wherein the operation assembly comprises a latch component and a connection component, the latch component and the connection component are slidably disposed on the cage, and the latch component is connected to the engagement component via the connection component.

15. The electronic device according to claim 14, wherein a slidable direction of the latch component is different from a slidable direction of the connection component.

16. The electronic device according to claim 14, wherein the casing has a positioning structure, and the latch component is selectively meshed with the positioning structure to position the cage.

17. The electronic device according to claim 14, wherein the operation assembly further comprises a slide knob, and the slide knob is fixed to the latch component.

18. The electronic device according to claim 14, wherein the operation assembly further comprises a button, and the button is fixed to the connection component.

19. The electronic device according to claim 13, wherein the operation assembly comprises a latch component, the latch component comprises a main portion and a pushing portion connected to each other, and the engagement component is selectively driven to disengage from the supporting component via the pushing portion of the latch component.

20. The electronic device according to claim 19, wherein the operation assembly further comprises a slide knob, and the slide knob is fixed to the main portion of the latch component.

* * * * *